US009547343B2

(12) United States Patent
Cho et al.

(10) Patent No.: US 9,547,343 B2
(45) Date of Patent: Jan. 17, 2017

(54) FLOW GUIDING MECHANISM AND RELATED HEAT DISSIPATING MODULE AND ELECTRONIC DEVICE HAVING THE FLOW GUIDING MECHANISM

(71) Applicant: Wistron Corporation, New Taipei (TW)

(72) Inventors: Shih-Huai Cho, New Taipei (TW); Kuan-Hsun Lu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/875,691

(22) Filed: Oct. 5, 2015

(65) Prior Publication Data
US 2016/0299542 A1    Oct. 13, 2016

(30) Foreign Application Priority Data

Apr. 10, 2015    (TW) .............................. 104111668 A

(51) Int. Cl.
*G06F 1/20*    (2006.01)
*H05K 7/20*    (2006.01)

(52) U.S. Cl.
CPC ............. *G06F 1/20* (2013.01); *H05K 7/20145* (2013.01); *H05K 7/20181* (2013.01)

(58) Field of Classification Search
CPC ............................. G06F 1/20; H05K 7/20145
USPC ......................... 361/679.49–679.51; 454/184
See application file for complete search history.

(56) References Cited

U.S. PATENT DOCUMENTS

| 6,042,348 | A | * | 3/2000 | Aakalu | .................... F04D 25/14 361/695 |
| 7,123,478 | B2 | | 10/2006 | Chen | |
| 8,064,200 | B1 | * | 11/2011 | West | .................. H05K 7/20563 361/694 |
| 8,199,501 | B2 | | 6/2012 | Sawai | |
| 8,422,227 | B2 | | 4/2013 | Lai | |
| 8,737,067 | B1 | * | 5/2014 | Kim | ..................... H05K 7/1492 342/175 |
| 8,885,335 | B2 | * | 11/2014 | Magarelli | ............... G06F 1/206 361/679.47 |
| 9,433,131 | B2 | * | 8/2016 | Joko | .................. H05K 7/20145 |

(Continued)

*Primary Examiner* — David M Sinclair
*Assistant Examiner* — Robert Brown
(74) *Attorney, Agent, or Firm* — Winston Hsu; Scott Margo

(57) ABSTRACT

A flow guiding mechanism with flow channel adjusting function is suitable to a heat dissipating module and an electronic device with an interface card. The flow guiding mechanism includes a supporting component, at least one ventilative structure and a plurality of sheltering components. The interface card is assembled with the supporting component in an assembly direction. The ventilative structure includes a plurality of openings, and the plurality of openings is formed on the supporting component in the assembly direction. The plurality of sheltering components is rotatably disposed on the supporting component. One of the plurality of sheltering components covers a corresponding opening of the plurality of openings while the interface card does not contact the foresaid sheltering component, and the interface card rotates the foresaid sheltering component relative to the supporting component to expose the corresponding opening while the interface card is assembled with the supporting component.

37 Claims, 15 Drawing Sheets

(56) References Cited

U.S. PATENT DOCUMENTS

| | | | |
|---|---|---|---|
| 2004/0252453 A1* | 12/2004 | Brooks | G06F 1/20 361/679.51 |
| 2004/0264128 A1* | 12/2004 | Crippen | G06F 1/183 361/679.49 |
| 2011/0069438 A1* | 3/2011 | Lin | G06F 1/181 361/679.5 |
| 2013/0168062 A1* | 7/2013 | Chang | H05K 7/20145 165/104.34 |

* cited by examiner

FLOW GUIDING MECHANISM AND RELATED HEAT DISSIPATING MODULE AND ELECTRONIC DEVICE HAVING THE FLOW GUIDING MECHANISM

BACKGROUND OF THE DISCLOSURE

1. Field of the Disclosure

The present disclosure relates to an electronic device having heat dissipating function, and more particularly, to a flow guiding mechanism with flow channel adjusting function and a related heat dissipating module and an electronic device having the flow guiding mechanism.

2. Description of the Prior Art

Operational efficiency and function of an electronic product are increased with the advanced technology, and the electronic product usually has a plurality of expansion cards to conform to application demand. Heat generated by the computer device is accordingly increased since an amount of the expansion card increases and operational efficiency of the expansion card is enhanced. The computer device includes a fan unit disposed inside the casing to generate flow to cool the expansion card, so as to dissipate the heat generated by the computer device and to prevent the computer device from crash. The conventional expansion card includes a full-height expansion card and a half-height expansion card according to its dimension. A height of the half-height expansion card is lower than a height of the full-height expansion card. When the full-height expansion card and the half-height expansion card are arranged on the circuit board in parallel, a gap is formed by height difference, which exists between an upper edge of the half-height expansion card and a lateral side of the full-height expansion card, the flow from the fan unit mostly passes through the gap, and temperature of the half-height expansion card cannot be effectively decreased.

There are several conventional solutions applied to overcome overheat of the half-height expansion card. One of the conventional solutions increases rotation speed of the fan unit to compensate loss of the heat dissipating efficiency because due to flow bypass; however, the foresaid solution has drawbacks of energy waste and expensive cost, and the flow results in turbulence inside the gap to decrease heat dissipating efficiency. Besides, the flow of the fan unit can be applied to flow over a plurality of expansion cards for cooling, the flow still flows over empty space without the expansion card and cannot be applied to other heat generating components.

SUMMARY OF THE DISCLOSURE

The present disclosure provides a flow guiding mechanism with flow channel adjusting function and a related heat dissipating module and an electronic device having the flow guiding mechanism for solving above drawbacks.

According to the claimed disclosure, a flow guiding mechanism with flow channel adjusting function suitable to be assembled with an electronic device having an interface card is disclosed. The flow guiding mechanism includes a supporting component, at least one ventilative structure and a plurality of sheltering components. The interface card is adapted to assemble with the supporting component in an assembly direction. The at least one ventilative structure includes a plurality of openings, and the plurality of openings is formed on the supporting component in the assembly direction. The plurality of sheltering components is rotatably disposed on the supporting component and respectively corresponds to the plurality of openings. One of the plurality of sheltering components covers a corresponding opening of the plurality of openings while the interface card does not contact the one of the plurality of sheltering components, and the interface card pushes some of the plurality of sheltering components to move relative to the supporting component to expose the corresponding openings while the interface card is assembled with the supporting component.

According to the claimed disclosure, the supporting component includes a main slab portion and a plurality of lateral slab portions. The ventilative structure is formed on the main slab portion, and the plurality of lateral slab portions is bent from the main slab portion to form an accommodating space. Flow generated by a flow generating unit of the electronic device flows toward the ventilative structure through the accommodating space.

According to the claimed disclosure, the flow guiding mechanism further includes a flank ventilative structure formed on at least one of the plurality of lateral slab portions.

According to the claimed disclosure, the plurality of openings at least includes a first opening and a second opening sequentially formed on the supporting component in the assembly direction, the plurality of sheltering components at least includes a first sheltering component and a second sheltering component rotatably disposed adjacent to the first opening and the second opening respectively, and the first sheltering component covers the first opening and the interface card moves the second sheltering component away from the second opening while the interface card is a half-height interface card assembled with the supporting component.

According to the claimed disclosure, the plurality of openings at least includes a first opening and a second opening sequentially formed on the supporting component in the assembly direction, the plurality of sheltering components at least includes a first sheltering component and a second sheltering component rotatably disposed adjacent to the first opening and the second opening respectively, the interface card moves the first sheltering component and the second sheltering component respectively away from the first opening and the second opening while the interface card is a full-height interface card assembled with the supporting component.

According to the claimed disclosure, each of the plurality of sheltering components includes a pivotal shaft, a sealing portion and a pushing portion. The pivotal shaft is disposed on a pivotal slot on the supporting component. The sealing portion stretches from the pivotal shaft to seal the corresponding opening. The pushing portion stretches from the pivotal shaft in an extending direction different from the sealing portion, and the interface card presses the pushing portion to rotate the pivotal shaft so as to move the sealing portion away from the corresponding opening.

According to the claimed disclosure, each of the plurality of sheltering components further includes a blocking portion disposed on an end of the sealing portion opposite to the pivotal shaft to lean against the supporting component or an adjacent sheltering component.

According to the claimed disclosure, the supporting component includes a track structure whereinside the interface card is disposed in the assembly direction.

According to the claimed disclosure, a planar normal vector of any opening of the plurality of openings is not perpendicular to the assembly direction.

According to the claimed disclosure, one of the plurality of sheltering components leans against the supporting component or an adjacent sheltering component by magnetic effect, so as to cover the corresponding opening.

According to the claimed disclosure, a heat dissipating module with flow channel adjusting function suitable to be assembled with an electronic device having an interface card is disclosed. The heat dissipating module includes a frame, a flow generating unit and a flow guiding mechanism. The flow generating unit is disposed on a side of the frame. The flow guiding mechanism is disposed on the other side of the frame opposite to the flow generating unit. The flow guiding mechanism includes a supporting component, at least one ventilative structure and a plurality of sheltering components. The interface card is adapted to assemble with the supporting component in an assembly direction. The at least one ventilative structure includes a plurality of openings, and the plurality of openings is formed on the supporting component in the assembly direction. The plurality of sheltering components is rotatably disposed on the supporting component and respectively corresponds to the plurality of openings. One of the plurality of sheltering components covers a corresponding opening of the plurality of openings while the interface card does not contact the one of the plurality of sheltering components, and the interface card pushes some of the plurality of sheltering components to move relative to the supporting component to expose the corresponding openings while the interface card is assembled with the supporting component.

According to the claimed disclosure, the frame includes an engaging structure whereinside the flow generating unit is slidably disposed.

According to the claimed disclosure, the supporting component utilizes a fixing component or a buckling component to be disposed on the frame.

According to the claimed disclosure, an electronic device suitable to optionally dispose an interface card includes a base and a heat dissipating module. The interface card is disposed on a socket of the base. The heat dissipating module includes a frame, a flow generating unit and a flow guiding mechanism. The flow generating unit is disposed on a side of the frame. The flow guiding mechanism is disposed on the other side of the frame opposite to the flow generating unit. The flow guiding mechanism includes a supporting component, at least one ventilative structure and a plurality of sheltering components. The interface card is adapted to assemble with the supporting component in an assembly direction. The at least one ventilative structure includes a plurality of openings, and the plurality of openings is formed on the supporting component in the assembly direction. The plurality of sheltering components is rotatably disposed on the supporting component and respectively corresponds to the plurality of openings. One of the plurality of sheltering components covers a corresponding opening of the plurality of openings while the interface card does not contact the one of the plurality of sheltering components, and the interface card pushes some of the plurality of sheltering components to move relative to the supporting component to expose the corresponding openings while the interface card is assembled with the supporting component.

The flow guiding mechanism of the present disclosure has a lot of flow gates (combinations of the sheltering component and the ventilative structure) to optimize heat dissipating function of the flow generating unit. The flow guiding mechanism utilizes several track structures to simultaneously assemble with a plurality of interface cards, and the flow of the flow generating unit is applied to cool the interface cards. Each interface card can rotate the corresponding sheltering component to expose the related ventilative structure while the interface card is assembled with the flow guiding mechanism, and the track structure without the interface card does not open the corresponding sheltering component. Therefore, the flow flows toward the unclosed ventilative structure instead of the closed ventilative structure, part of the flow further can be guided toward the flank ventilative structure while most of the ventilative structures are closed, and the heat generating component (located by the supporting component) can be cooled evidently. The cooling flow of the flow generating unit passes through the ventilative structure where the interface card is installed accordingly, and the ventilative structure without the interface card is covered by the sheltering component, part of the cooling flow further flows toward the flank ventilative structure to cool the heat generating component except the interface card. The flow guiding mechanism and the related heat dissipating module and the electronic device of the present disclosure can effectively economize application of the cooling flow, and automatically open or close the ventilative structure according to assembly of the interface card.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
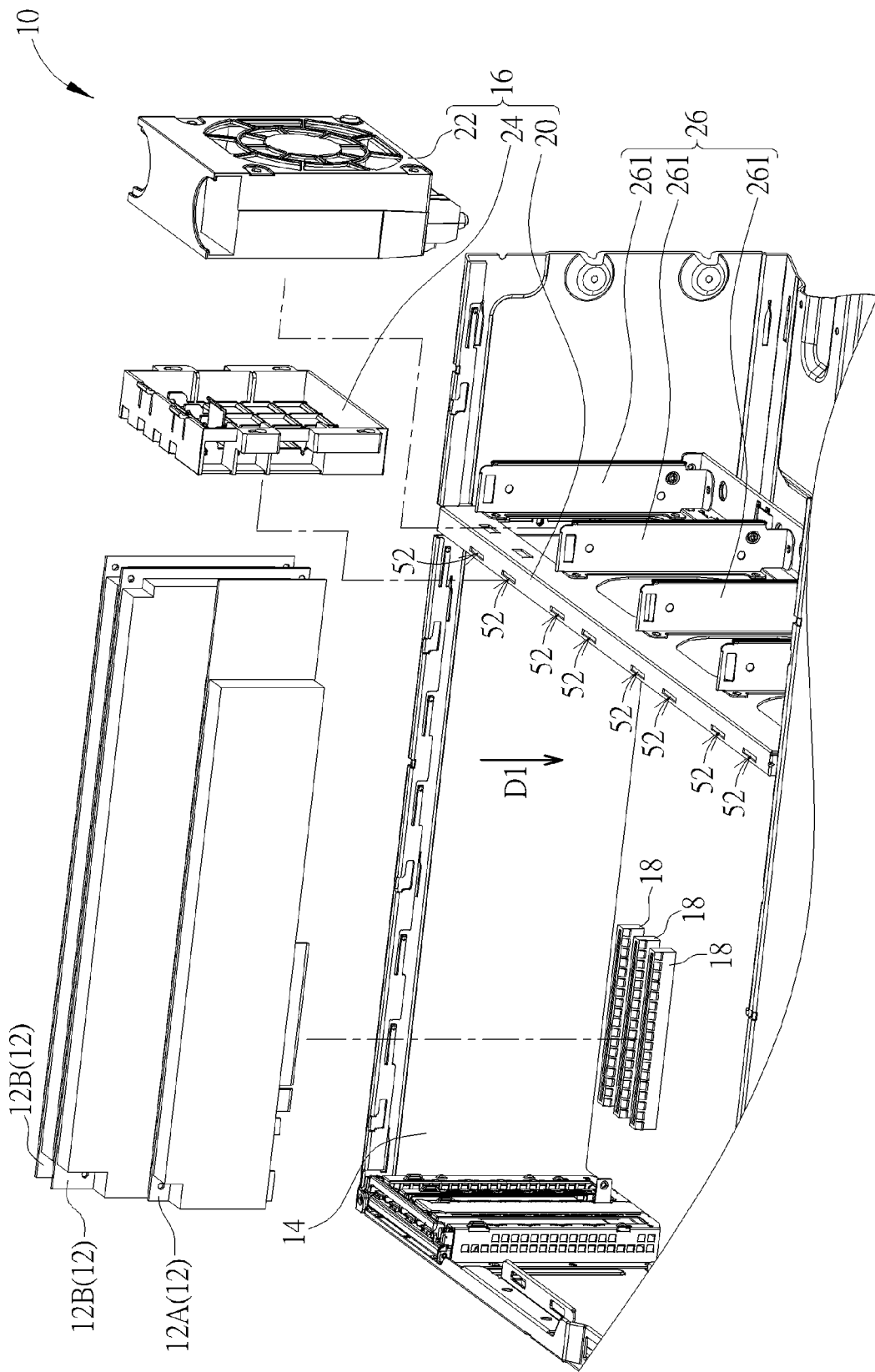
FIG. 1 is an exploded diagram of an electronic device according to an embodiment of the present disclosure.
Figure 2:
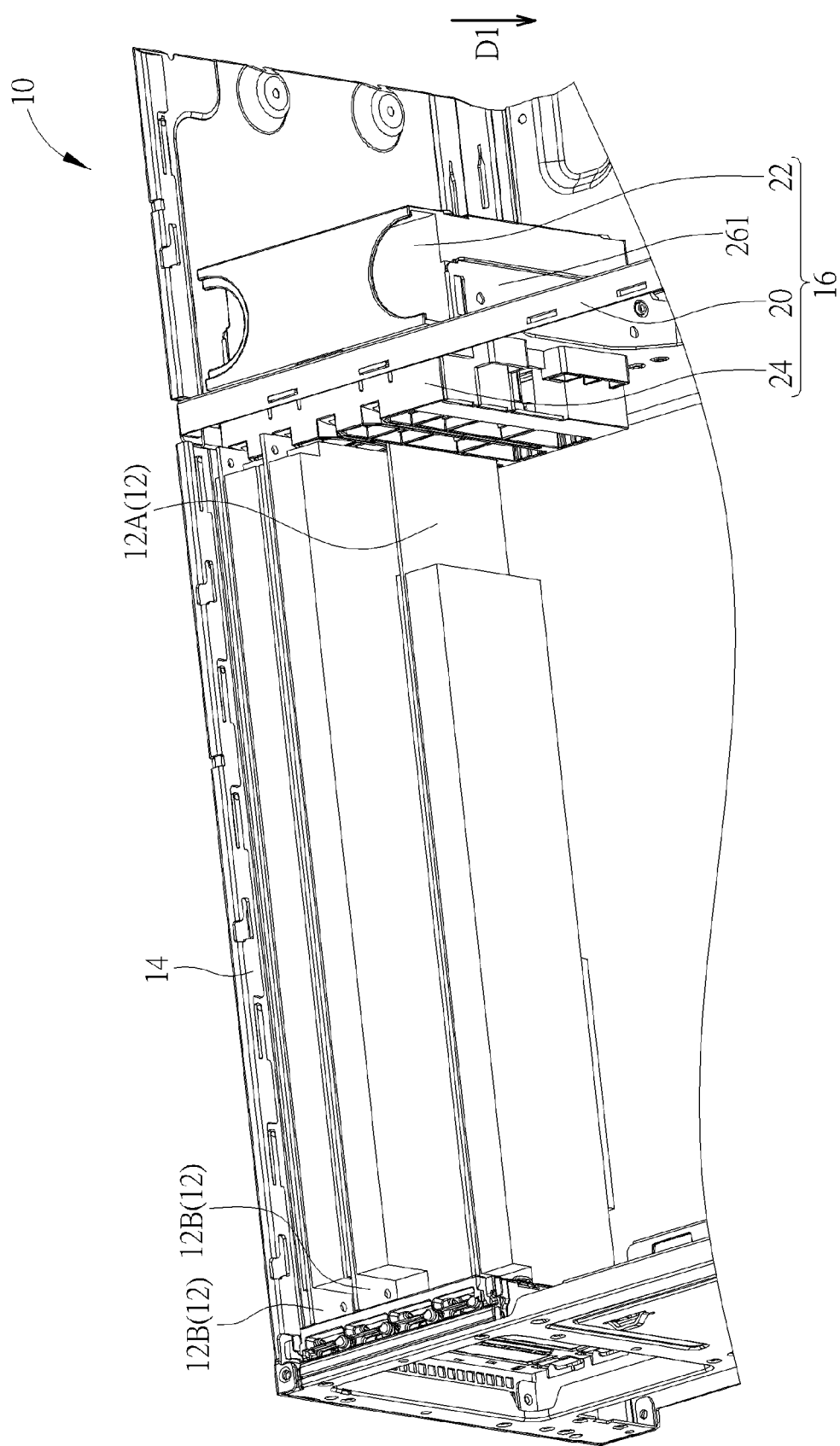
FIG. 2 is an assembly diagram of the electronic device according to the embodiment of the present disclosure.

Please refer to FIG. 1 and FIG. 2. FIG. 1 is an exploded diagram of an electronic device 10 according to an embodiment of the present disclosure. FIG. 2 is an assembly diagram of the electronic device 10 according to the embodiment of the present disclosure. The electronic device 10 is suitable to dispose an interface card 12 optionally. An amount of the interface card 12 is not limited to and the interface card 12 can be a half-height interface card 12A or a full-height interface card 12B. The electronic device 10 includes a base 14 and a heat dissipating module 16. The base 14 is a housing of the electronic device 10, and has several sockets 18 whereto the interface card 12 can be connected. The heat dissipating module 16 includes a frame 20, a flow generating unit 22 and a flow guiding mechanism 24. The frame 20 is disposed inside the base 14 to be a positioning component where the flow generating unit 22 and the flow guiding mechanism 24 are installed. The frame 20 includes an engaging structure 26 mainly composed of several partitions 261, and a slide track is formed on each of the partitions 261. The flow generating unit 22 is disposed between the two partitions 261 by the slide tracks to be set on a side of the frame 20. The flow guiding mechanism 24 is disposed on the other side the frame 20 opposite to the flow generating unit 22. The flow generating unit 22 preferably can be a fan unit, and flow (such as airflow) generated by the fan unit passes through the frame 20 and the flow guiding mechanism 24 to cool the interface card 12, so as to dissipate heat generated from the interface card 12.

Figure 3A:
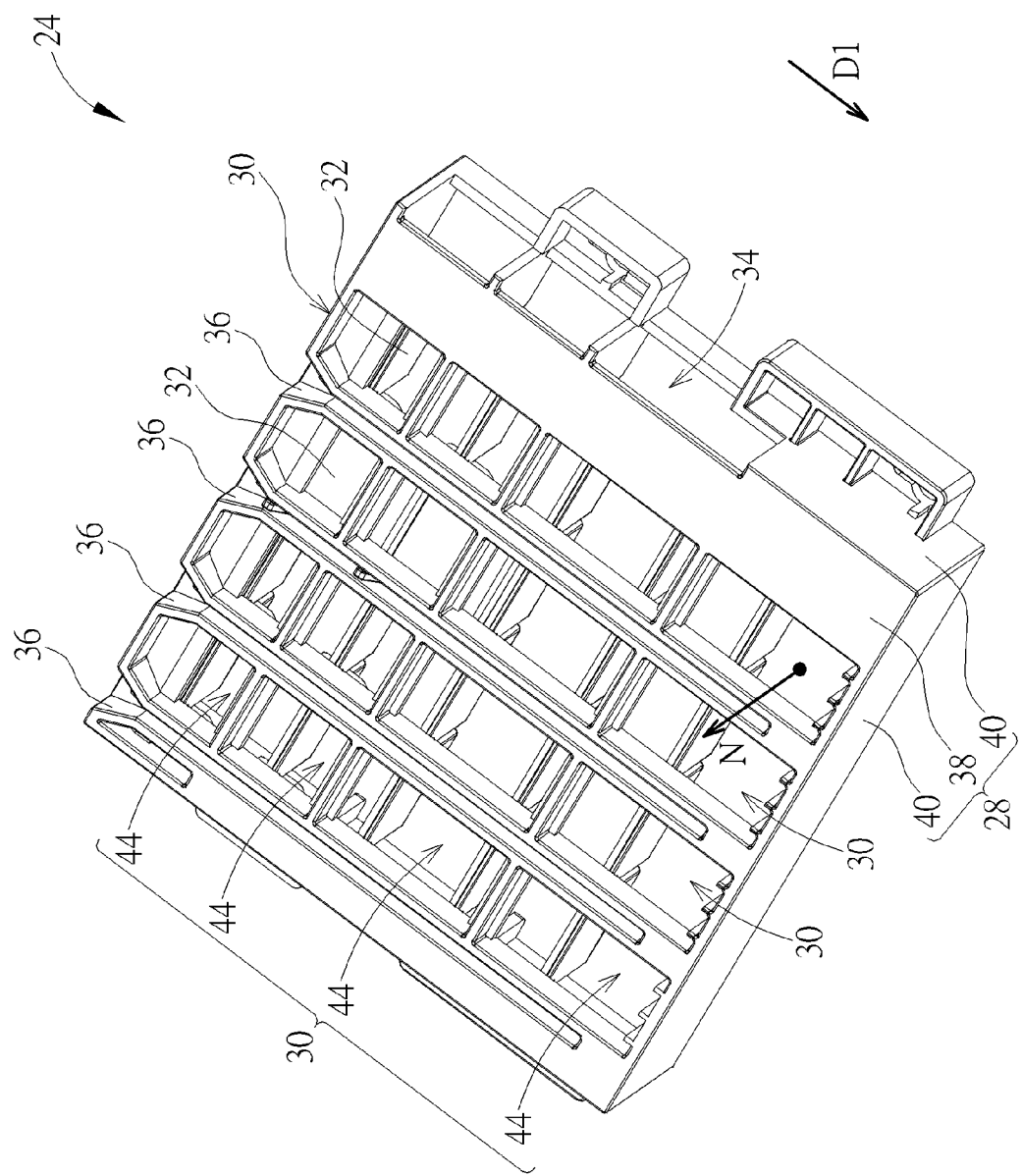
FIG. 3A, FIG. 3B and FIG. 4 respectively are diagrams of a flow guiding mechanism in different views according to the embodiment of the present disclosure.
Figure 3B:
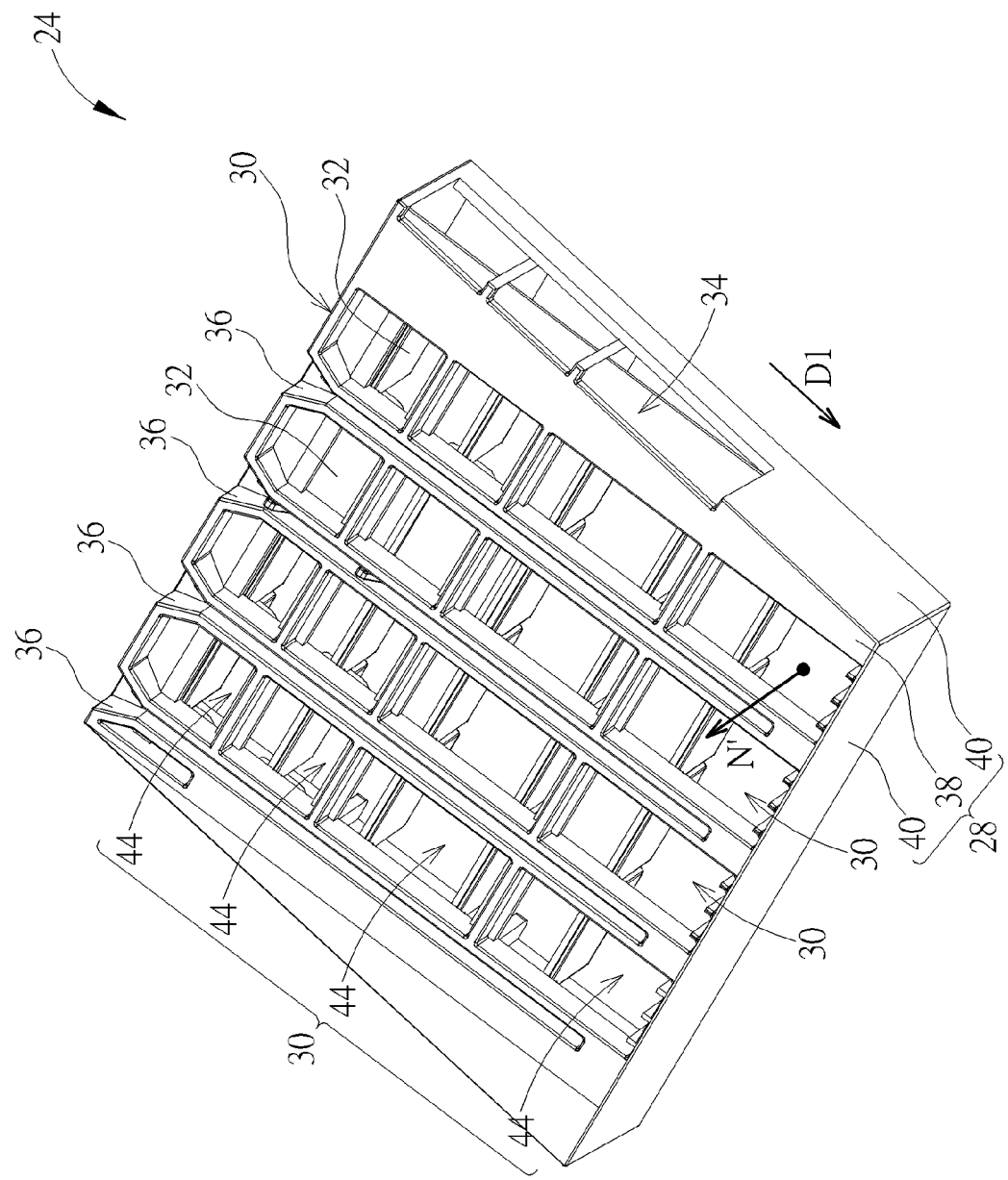
Figure 4:
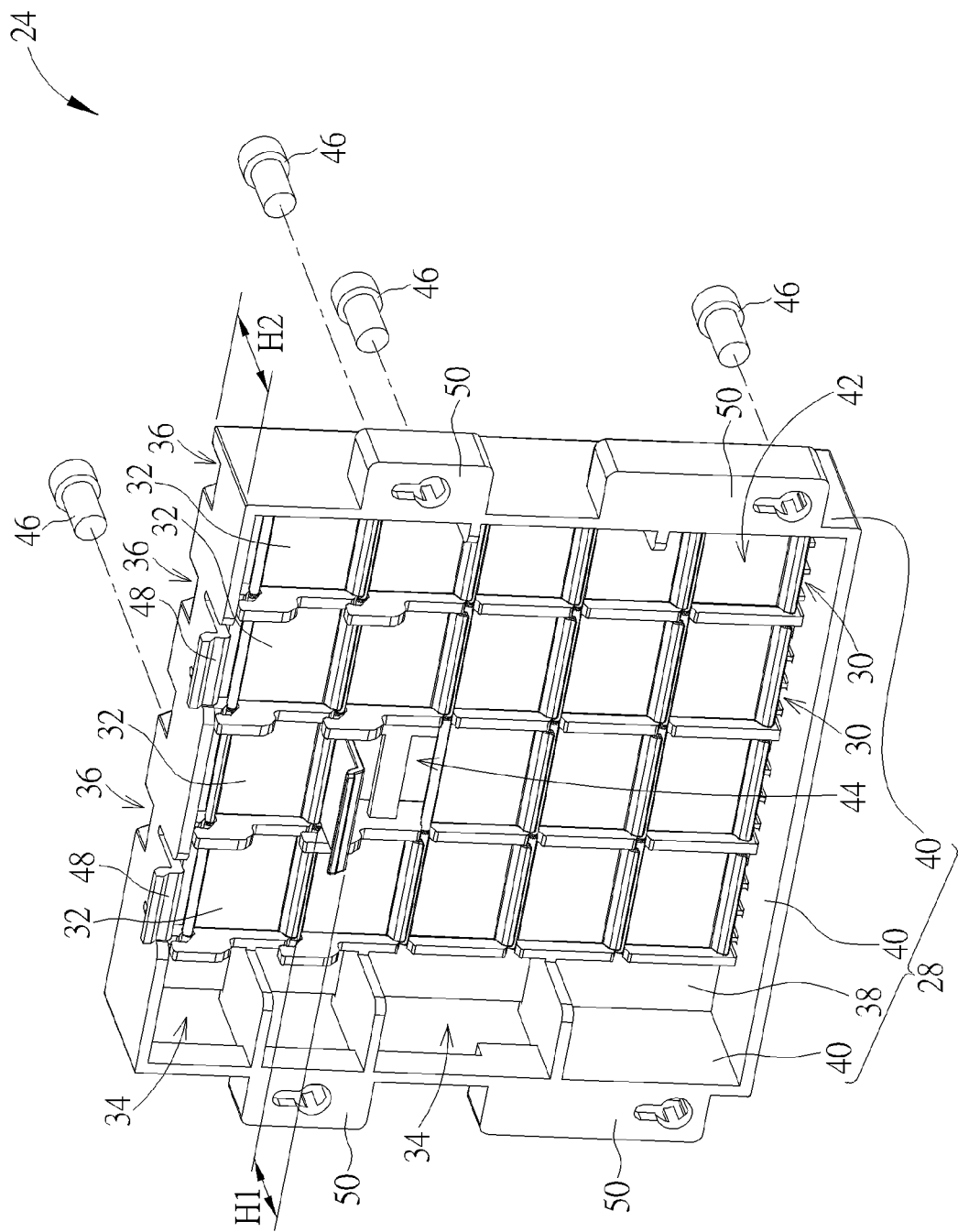

Please refer to FIG. 3A, FIG. 3B and FIG. 4. FIG. 3 and FIG. 4 respectively are diagrams of the flow guiding mechanism 24 in different views according to the embodiment of the present disclosure. The flow guiding mechanism 24 at least includes a supporting component 28, a ventilative structure 30, a sheltering component 32 and a flank ventilative structure 34. The supporting component 28 can be detachably disposed on the frame 20 by a fixing component 46 and/or the buckling component 48. The fixing component 46 pierces through a locking hole portion 50 of the supporting component 28 to fix on the frame 20, and the buckling component 48 is buckled with a sunken slot 52 of the frame 20 (which is shown in FIG. 1). The supporting component 28 includes a plurality of track structures 36, and an amount of the track structure 36 corresponds to an amount of the ventilative structure 30. This embodiment illustrates, but not limited to, the flow guiding mechanism 24 with four ventilative structures 30 and four track structures 36. The interface card 12 is slidably disposed inside the corresponding track structure 36 in an assembly direction D1 to assemble with the supporting component 28. The supporting component 28 includes a main slab portion 38 and a plurality of lateral slab portions 40. The plurality of lateral slab portions 40 is respectively bent from edges of the main slab portion 38 to form an accommodating space 42, and the flow generating unit 22 faces inner of the accommodating space 42. A plurality of ventilative structures 30 is formed on the main slab portion 38 in parallel, and the flank ventilative structure 34 is formed on one or more lateral slab portions 40. For example, the flank ventilative structure 34 is preferably formed on the lateral slab portions 40 located on a left side and a right side of the main slab portion 38 and having the locking hole portion 50, and the flow (or the airflow) can be guided to heat generating components (which are not the interface card 12) adjacent by the supporting component 28 due to the flank ventilative structure 34. The sheltering component 32 is rotatably disposed on the supporting component 28 and can be freely opened or closed within the accommodating space 42.

The plurality of ventilative structures 30 of the flow guiding mechanism 24 is disposed on the supporting component 28 in an adjacently parallel arrangement, to be respectively matched with the corresponding interface cards 12. Each of the ventilative structures 30 includes a plurality of opening 44 sequentially formed on the main slab portion 38 in the assembly direction D1. An amount of the sheltering component 32 corresponds to an amount of the opening 44. Each of the sheltering components 32 is disposed adjacent by the corresponding opening 44 to cover or to expose the opening 44 by rotation. The sheltering component 32 can be switched between an open mode (such as exposing the opening 44) and a closed mode (such as covering the opening 44) according to position variation of the interface card 12. For example, while the interface card 12 does not contact the sheltering component 32, which represents no external force is applied to the sheltering component 32, the sheltering components 32 hang down to cover the corresponding opening 44 because of gravity effect. While an external force is applied to the supporting component 28, such as the interface card 12 pressing over the sheltering component 32, the sheltering component 32 is moved relative to the supporting component 28 to be away from the corresponding opening 44 and for exposedness the opening 44; meanwhile, the flow (or the airflow) generated by the flow generating unit 22 flows toward the interface card 12 through the accommodating space 42 and the opening 44. For instance, the sheltering component 32 is preferably rotated relative to the supporting component 28.

As shown in FIG. 3A, any opening 44 of the plurality of openings 44 has a planar normal vector N (which is equal to a planar normal vector of the main slab portion 38), and the planar normal vector N is substantially perpendicular to the assembly direction D1. In another embodiment such shown in FIG. 3B, the planar normal vector N' of any opening 44 of the plurality of openings 44 is not perpendicular to the assembly direction D1. A rotary angle of the sheltering component 32 can be adjusted according to an included angle between the planar normal vector N' and the assembly direction D1, so wind pressure of the flow (or the airflow) flowing through the opening 44 can be increased or decreased by guiding-flow design of the sheltering component 32 and/or the opening 44, so as to effectively improve heat dissipating efficiency of the heat dissipating module 16.

Figure 5:
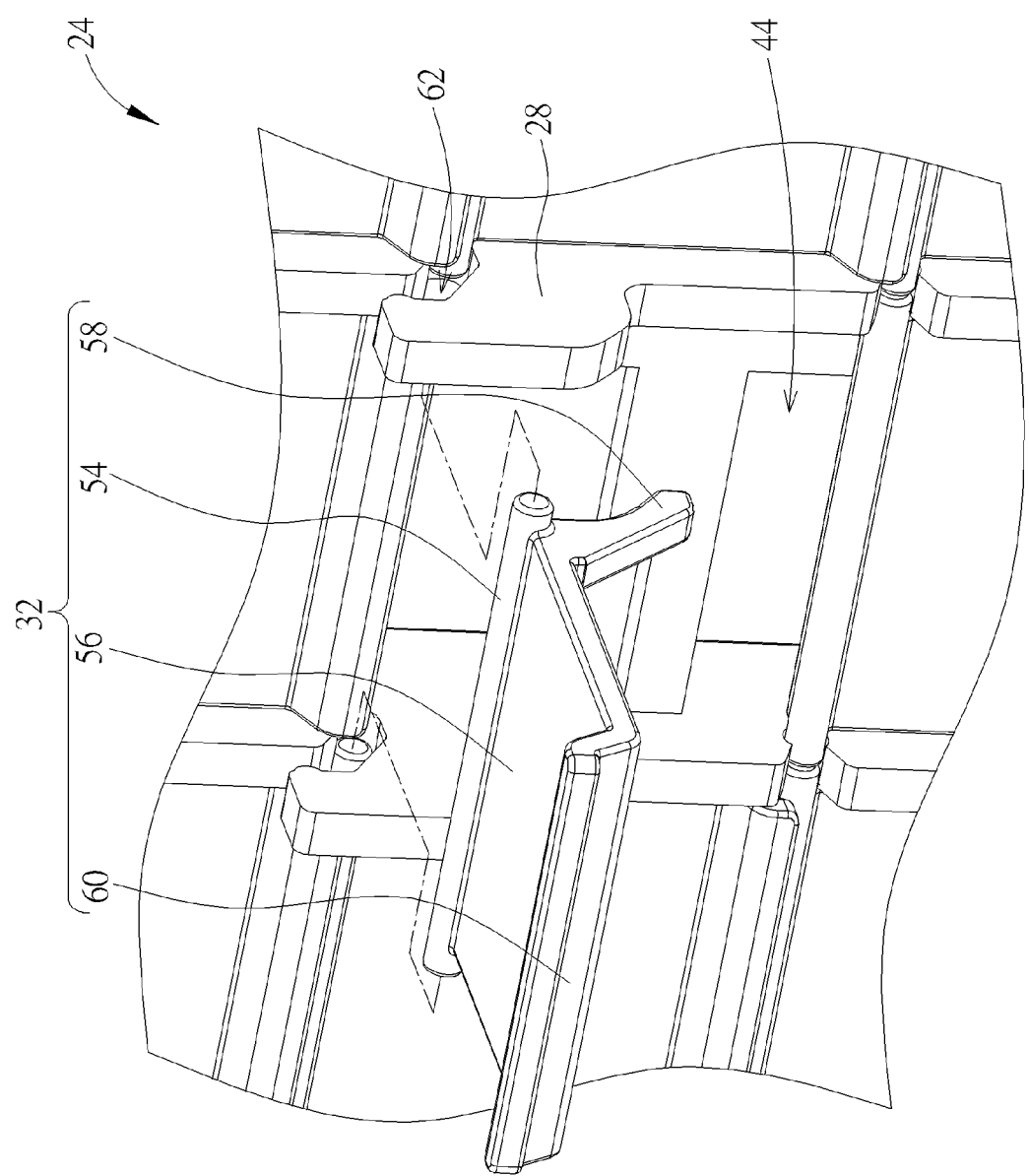
FIG. 5 is an exploded diagram of part of the flow guiding mechanism shown in FIG. 4.

Please refer to FIG. 3 to FIG. 9. FIG. 5 is an exploded diagram of part of the flow guiding mechanism 24 shown in FIG. 4. FIG. 6 to FIG. 9 respectively are diagrams of the flow guiding mechanism 24 and the interface card 12 in different operational modes according to the embodiment of the present disclosure. The sheltering component 32 includes a pivotal shaft 54, a sealing portion 56, a pushing portion 58 and a blocking portion 60. The supporting component 28 has a pivot slot 62 with a narrow breach and a wide inner. The pivotal shaft 54 is installed into the pivotal slot 62 in a resilient deformable manner, and can freely rotate within the pivotal slot 62.

The sealing portion 56 stretches from the pivotal shaft 54, and the pushing portion 58 stretches from the pivotal shaft 54 in an extending direction D2 different from the sealing portion 56. For example, an included angle between the sealing portion 56 and the pushing portion 58 can be, but not limited to, substantially equal to ninety degrees. The pivotal shaft 54 can rotate inside the pivotal slot 62 while the pushing portion 58 is pressed, and the sealing portion 56 is rotated to switch between the closed mode shown in FIG. 6 and the open mode shown in FIG. 9. The sealing portion 56 in the closed mode covers the opening 44 to prevent the flow generated by the flow generating unit 22 from passing through the supporting component 28. It should be mentioned that the pushing portion 58 is preferably hidden inside the track structure 36, and the interface card 12 slides into the track structure 36 to press the pushing portion 58. The blocking portion 60 is disposed on an end of the sealing portion 56 different from position of the pivotal shaft 54. While the sealing portion 56 seals the opening 44, the blocking portion 60 may lean against the supporting component 28 or the adjacent sheltering component 32.

For averting the sheltering component 32 in the closed mode from departing from the opening 44 by wind force of the airflow, the sheltering component 32 further can include a magnetic unit disposed on the blocking portion 60, or the blocking portion 60 is made of magnetic material. The supporting component 28 is made of ferromagnetic material, or the supporting component 28 includes a magnetic unit disposed on a position relative to the blocking portion 60, or the pivotal shaft 54 adjacent by the sheltering component 32 is made of ferromagnetic material or has a magnetic unit. Thus, the sheltering component 32 can lean against the supporting component 28 by magnetic effect, to ensure the closed ventilative structure 30 is not opened by flow (or the airflow) generated by the flow generating unit 22.

Figure 6:
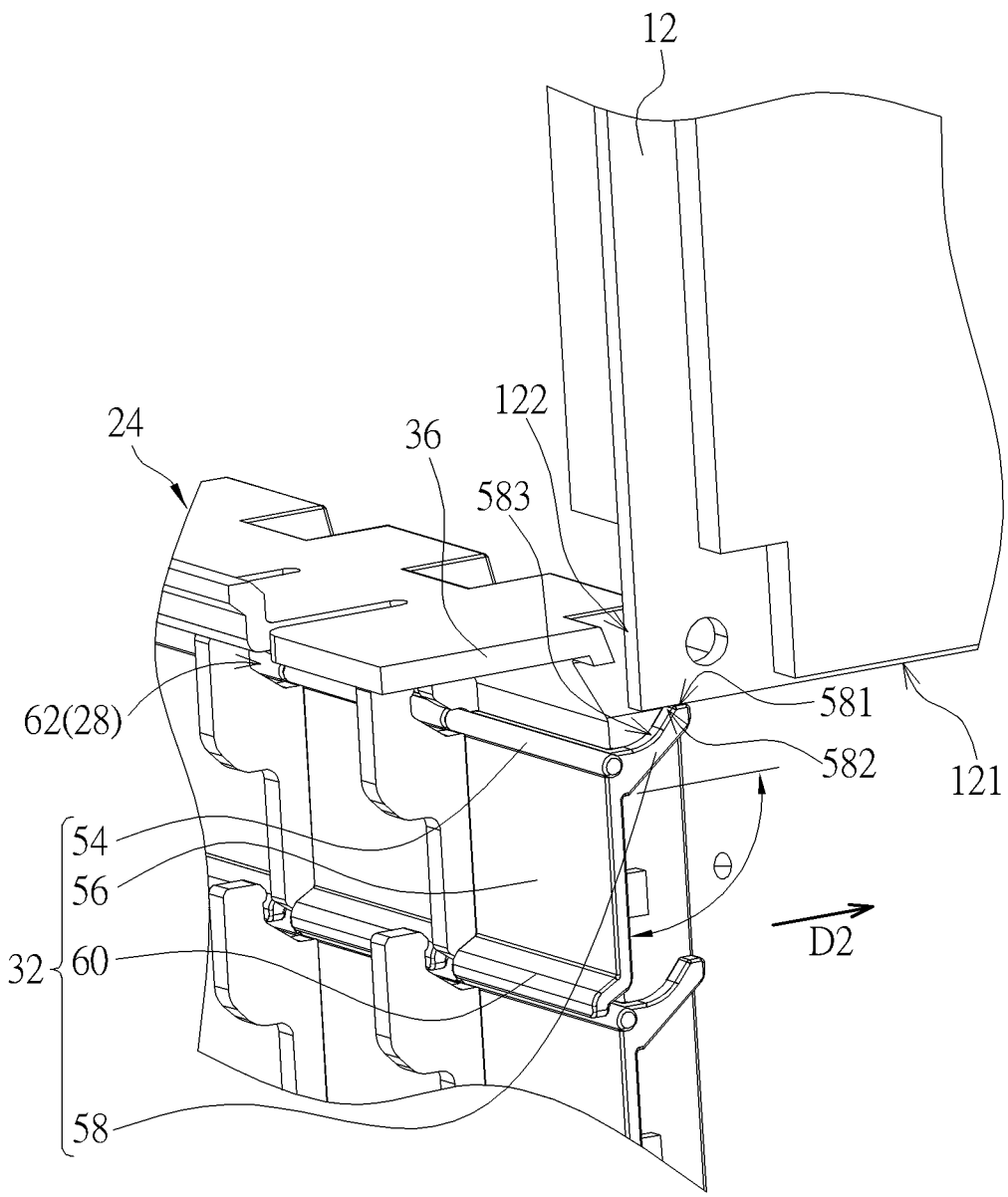
FIG. 6 to FIG. 9 respectively are diagrams of the flow guiding mechanism and the interface card 12 in different operational modes according to the embodiment of the present disclosure.
Figure 7:
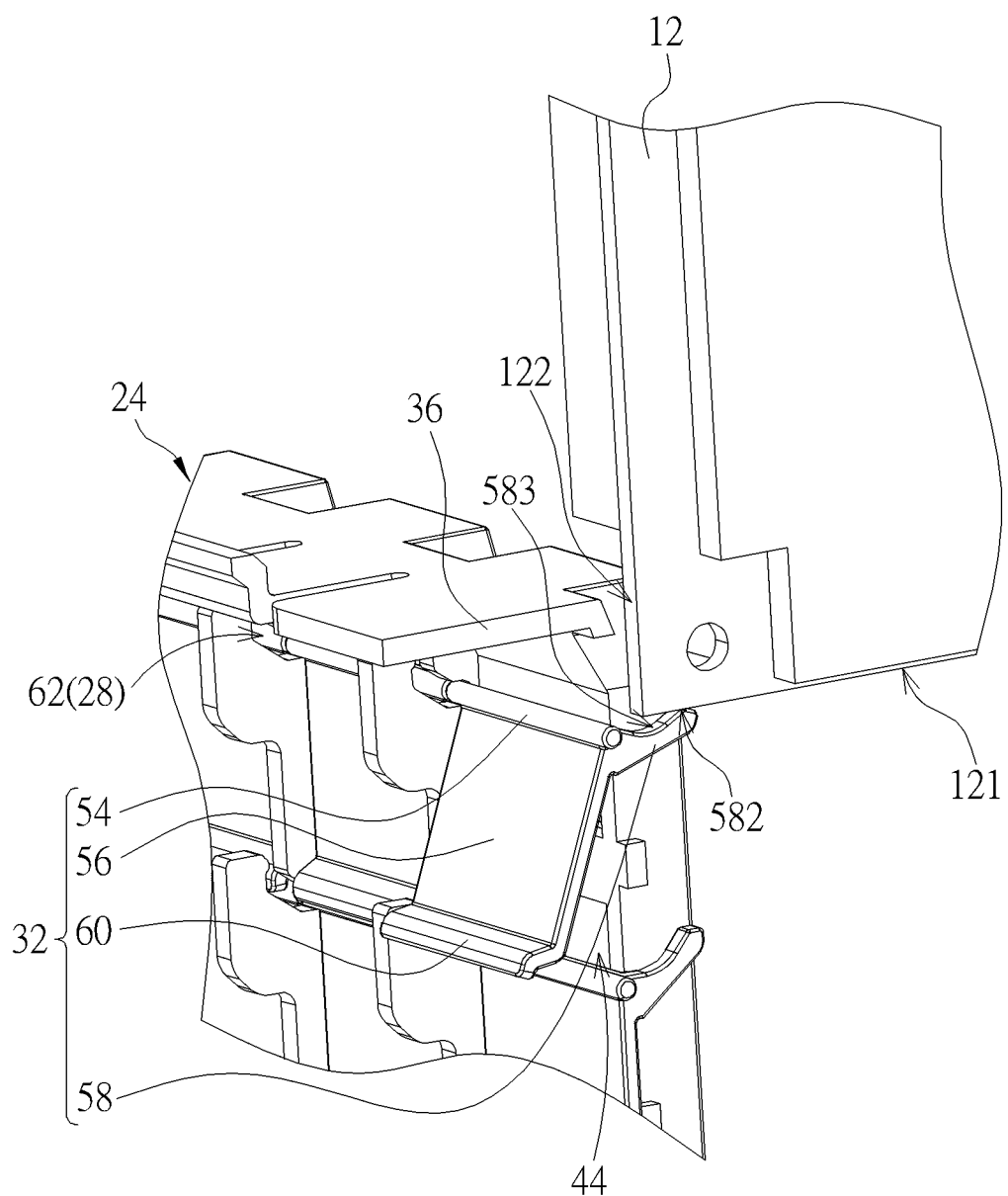
Figure 8:
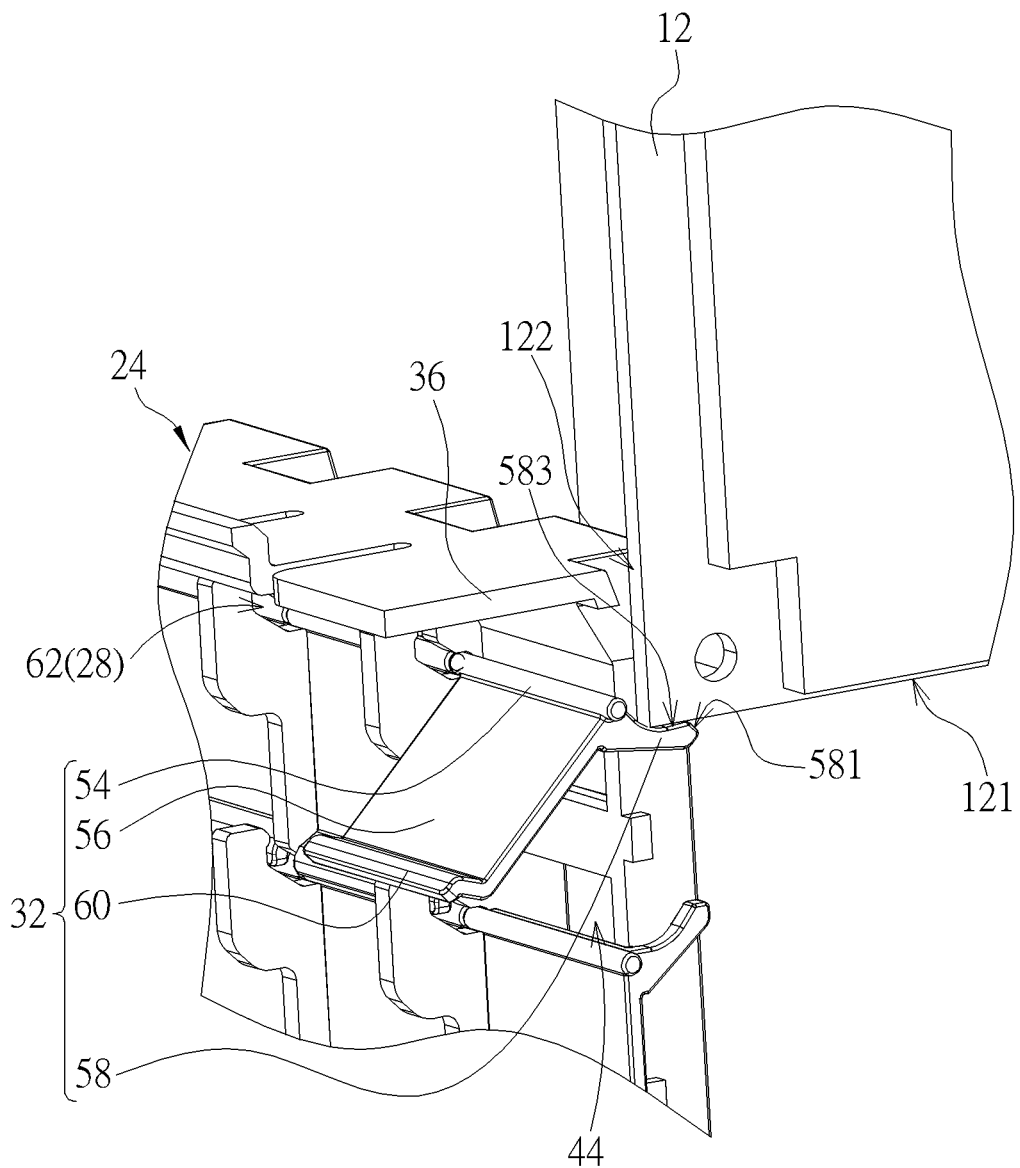
Figure 9:
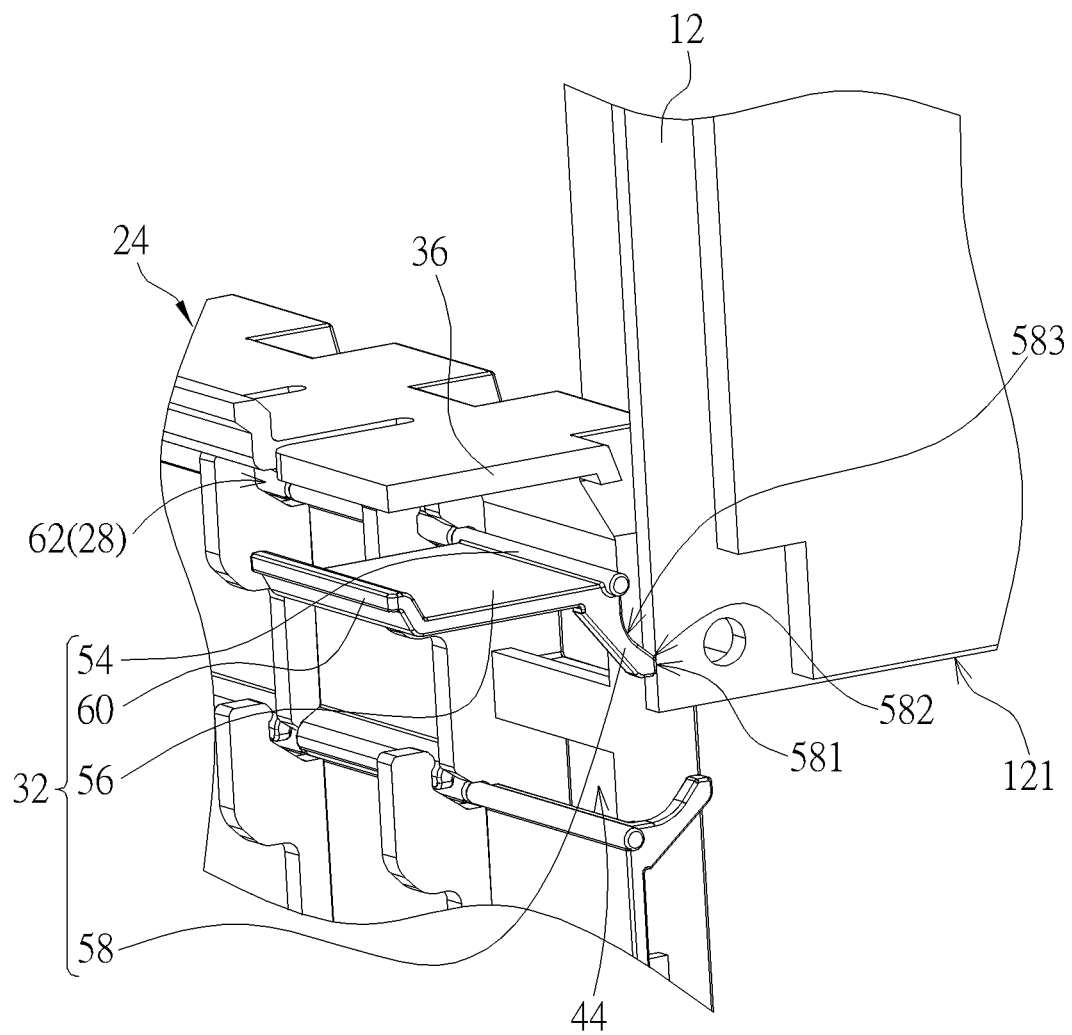

As shown in FIG. 6, the interface card 12 does not press the sheltering component 32, and the sheltering component 32 hangs down to cover the opening 44 by the gravity effect. While the sheltering component 32 is in the closed mode, the blocking portion 60 leans against the supporting component 28 or the adjacent sheltering component 32 to prevent the sheltering component 32 from vibration by the flow (or the airflow) from the flow generating unit 22. As the interface card 12 inserts into the track structure 36, a bottom edge 121 of the interface card 12 presses over a contacting surface 581 of the pushing portion 58. As shown in FIG. 7 and FIG. 8, the bottom edge 121 drives the sheltering component 32 to rotate while the interface card 12 slides along the track structure 36 downward, and then the bottom edge 121 moves from the contacting surface 581 to an inclined guiding surface 583 of the pushing portion 58 via a corner 582. In a procedure of the interface card 12 downwardly pressing the pushing portion 58, the pivotal shaft 54 is rotated inside the pivotal slot 62, and the sealing portion 56 is outward rotated to move away from the opening 44. As shown in FIG. 9, while the interface card 12 slides inside the track structure 36 and connects to the socket 18, a lateral edge 122 of the interface card 12 leans against the inclined guiding surface 583, the interface card 12 provides a blocking function to keep the sheltering component 32 in the open mode, and the sealing portion 56 is distant from the supporting component 28 to expose the opening 44.

Please refer to FIG. 4 and FIG. 9, an included angle formed between the sheltering component 32 in the open mode and the supporting component 28 substantially equals ninety degrees, a height H1 of the sealing portion 56 is smaller than a depth H2 of the accommodating space 42, motion of the sealing portion 56 is activated inside the accommodating space 42 to switch between the open mode and the closed mode, and the sealing portion 56 does not protrude out of the accommodating space 42 to avoid the sealing portion 56 from structural interference when hitting the frame 20 and/or the flow generating unit 22. While the sheltering component 32 is switched in the closed mode, the blocking portion 60 leans against the supporting component 28 or the adjacent sheltering component 32 to stop the sealing portion 56 from inserting into the opening 44, to ensure that the sealing portion 56 does not project over the main slab portion 38 of the supporting component 28 to collide with the interface card 12.

Figure 10:
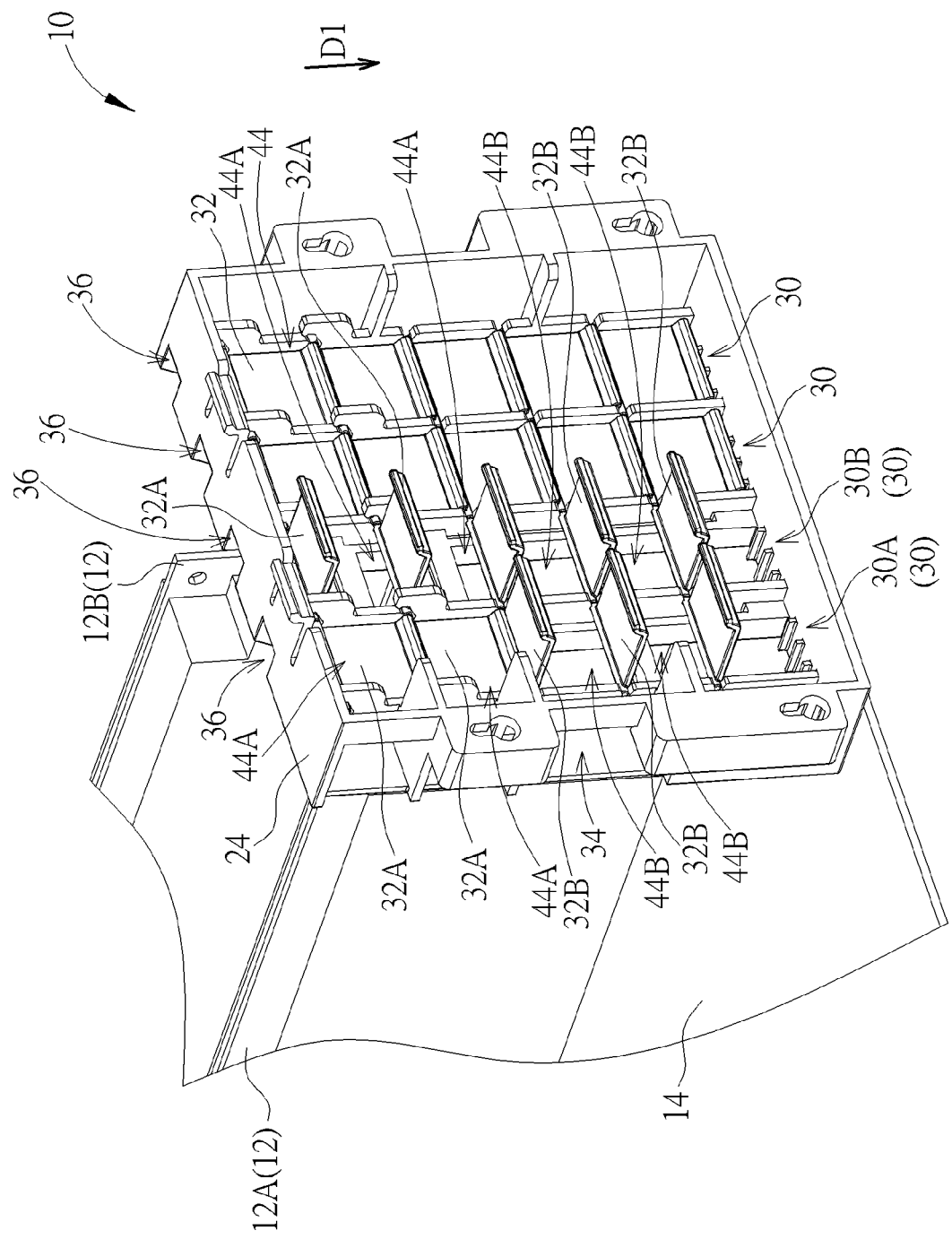
FIG. 10 is a diagram of the electronic device with a half-height interface card and a full-height interface card according to the embodiment of the present disclosure.

Please refer to FIG. 10. FIG. 10 is a diagram of the electronic device 10 with the half-height interface card 12A and the full-height interface card 12B according to the embodiment of the present disclosure. The flow guiding mechanism 24 includes a first ventilative structure 30A and a second ventilative structure 30B. The plurality of openings 44 of the first ventilative structure 30A and the second ventilative structure 30B at least includes a first opening 44A and a second opening 44B sequentially formed on the supporting component 28 in the assembly direction D 1. For instance, the first opening 44A is located in a high position and distant from bottom of the base 14, which represents a distance between the first opening 44A and the bottom of the base 14 is greater than height of the half-height interface card 12A. The second opening 44B is located in a low position and close to the bottom of the base 14, and a distance between the second opening 44B and the bottom of the base 14 is smaller than the height of the half-height interface card 12A. The plurality of sheltering components 32 at least includes a first sheltering component 32A and a second sheltering component 32B. The first sheltering component 32A is rotatably disposed adjacent to the first opening 44A, and the second sheltering component 32B is rotatably disposed adjacent to the second opening 44B.

While the half-height interface card 12A just slides into the track structure 36, the half-height interface card 12A rotates the first sheltering component 32A of the first ventilative structure 30A to expose the first opening 44A. Since the half-height interface card 12A goes deep into the track structure 36 to connect with the socket 18 of the base 14, as shown in FIG. 10, the half-height interface card 12A can press the second sheltering component 32B to rotate relative to the supporting component 28 but not contact the first sheltering component 32A, the first sheltering component 32A is hanged down to cover the first opening 44A by the gravity effect, and the second sheltering component 32B is switched in the open mode to expose the second opening 44B. The flow (or the airflow) generated by the flow generating unit 22 cannot pass through the first opening 44A of the first ventilative structure 30A and flows over the half-height interface card 12A via the second opening 44B of the first ventilative structure 30A, so that heat generated from the half-height interface card 12A can be rapidly dissipated by air-cooling function of the heat dissipating module 16. There is no flow (or the airflow) passing through upper space (which represents a vertical gap between the half-height interface card 12A and the full-height interface card 12B) of the half-height interface card 12A, to prevent heat dissipating efficiency of the electronic device 10 from decrease by turbulence existing inside the foresaid vertical gap.

While the full-height interface card 12B is assembled with the supporting component 28 and goes deep into the track structure 36 gradually, the first sheltering component 32A and the second sheltering component 32B of the second ventilative structure 30B are sequentially rotated by push of the full-height interface card 12B to be away from the first opening 44A and the second opening 44B, which means all openings 44 of the second ventilative structure 30B are opened. The flow (or the airflow) generated by the flow generating unit 22 flows over the full-height interface card 12B through the foresaid openings 44 (including the first opening 44A and the second opening 44B), and heat generated from the full-height interface card 12B can be effectively dissipated by the cooling flow. In addition, the flow generated by the flow generating unit 22 can partly pass through the flow guiding mechanism 24 via the flank ventilative structure 34 no matter whether the interface card 12 is disposed by the ventilative structure 30 of the flow guiding mechanism 24, to cool the heat generating components (such as the central processing unit and/or the main board) disposed by the interface card 12 in the electronic device 10.

Figure 11:
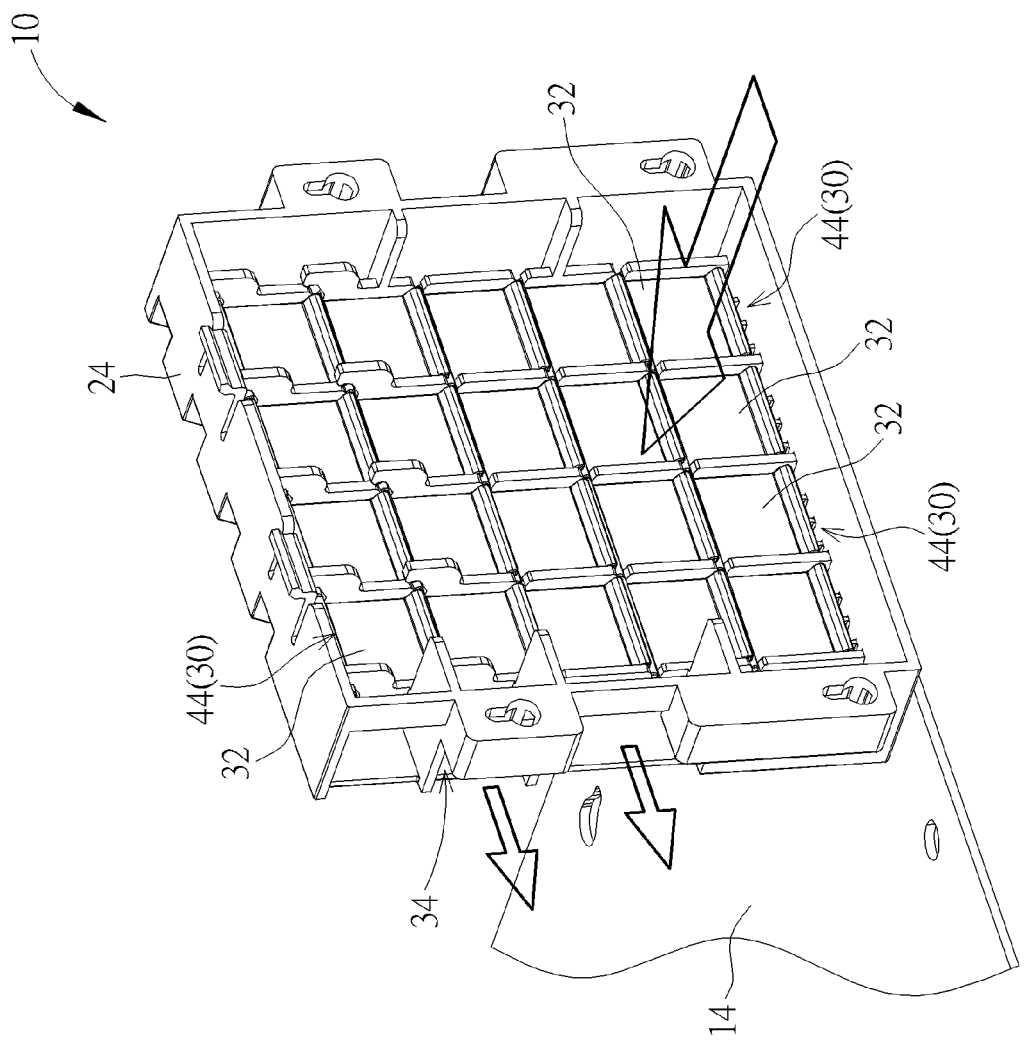
FIG. 11 and FIG. 12 respectively are diagrams of the electronic device in different operational modes according to the embodiment of the present disclosure.
Figure 12:
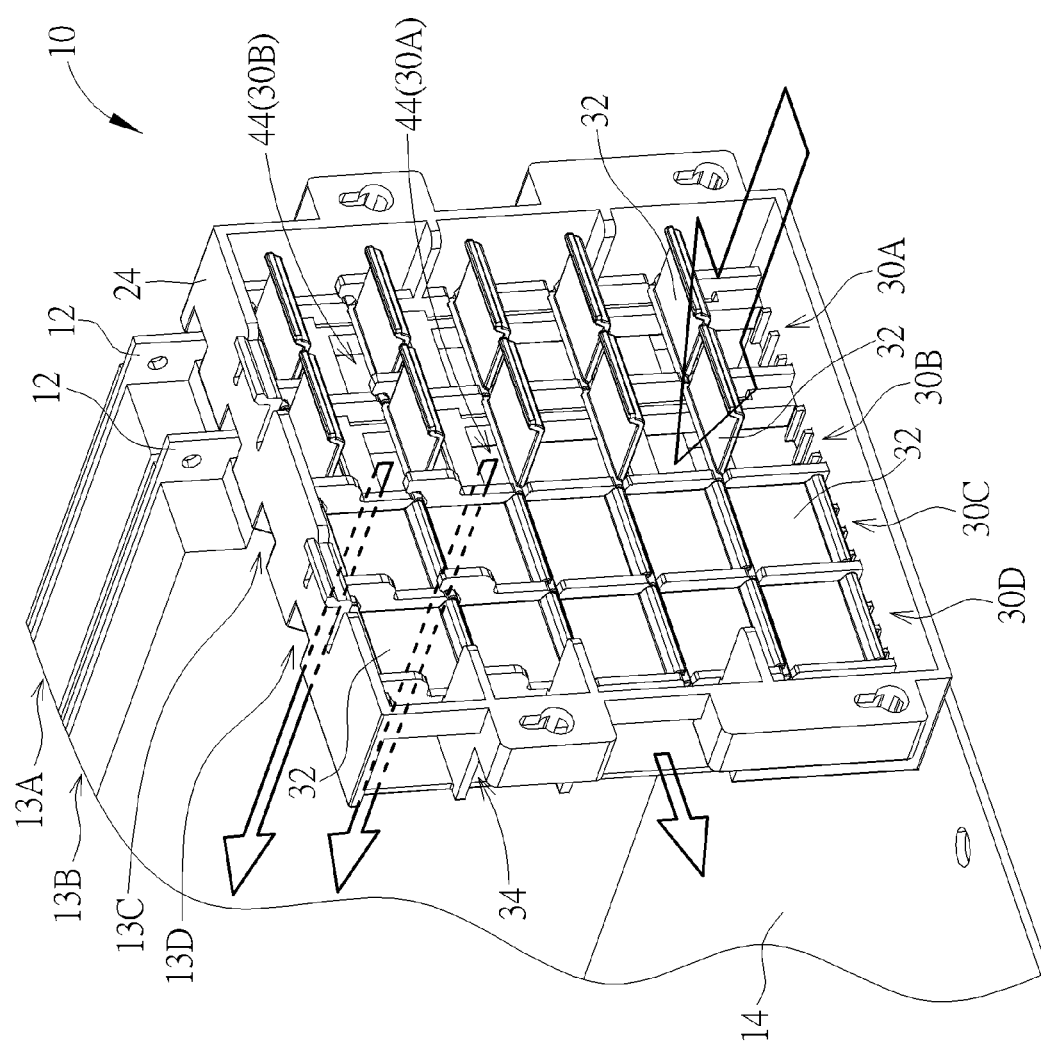

Please refer to FIG. 11 and FIG. 12. FIG. 11 and FIG. 12 respectively are diagrams of the electronic device 10 in different operational modes according to the embodiment of the present disclosure. As shown in FIG. 11, there is no interface card inside the electronic device 10, the whole sheltering components 32 of the flow guiding mechanism 24 are in the closed mode to cover the openings 44, which means the flow (as an arrow shown in figures) generated by the flow generating unit 22 passes through the flow guiding mechanism 24 via the flank ventilative structure 34 instead of passing through the ventilative structures 30. As shown in FIG. 12, the interface cards 12 are respectively disposed on the first ventilative structure 30A and the second ventilative structure 30B of the electronic device 10. The two interface cards 12 both are the full-height interface card, the interface cards 12 can press over all sheltering components 32 of the first ventilative structure 30A and the second ventilative structure 30B, and the sheltering components 32 are switched in the open mode to expose the whole openings 44. Thus, the flow (as an arrow shown in figures) generated by the flow generating unit 22 not only passes through the flank ventilative structure 34, but also passes through the first ventilative structure 30A and the second ventilative structure 30B to flow over the interface cards 12 for heat dissipation.

In the embodiment, the flow guiding mechanism 24 includes four ventilative structures 30, and the four ventilative structures 30 may be optionally switched to different modes to open or close the openings 44 according as the amount of the interface card 12. As shown in FIG. 12, the first ventilative structure 30A is set relative to a first interface card slot 13A, the second ventilative structure 30B is set relative to a second interface card slot 13B, the third ventilative structure 30C is set relative to a third interface card slot 13C, and the fourth ventilative structure 30D is set relative to a fourth interface card slot 13D. Experimental data of the flow guiding mechanism 24 is illustrated in Table 1. When the flow guiding mechanism 24 is switched in a first mode, the openings 44 of the first ventilative structure 30A, the second ventilative structure 30B, the third ventilative structure 30C and the fourth ventilative structure 30D are open, the first ventilative structure 30A, the second ventilative structure 30B, the third ventilative structure 30C and the fourth ventilative structure 30D are cooled by the flow of the flow generating unit 22. Flow rate (linear feet per minute, LFM) of each interface card slot is varied according to position of the flow generating unit 22.

While the flow guiding mechanism 24 is switched in a second mode, the opening 44 of the fourth ventilative structure 30D is closed, the openings 44 of the first ventilative structure 30A, the second ventilative structure 30B and the third ventilative structure 30C are still open, the flow rate of the fourth ventilative structure 30D is decreased, the flow rate of the first ventilative structure 30A, the second ventilative structure 30B and the third ventilative structure 30C are increased accordingly, as illustrated in Table 1. While flow guiding mechanism 24 is switched in a third mode, the openings 44 of the third ventilative structure 30C and the fourth ventilative structure 30D are closed, the openings 44 of the first ventilative structure 30A and the second ventilative structure 30B are open, the flow rate of the third ventilative structure 30C and the fourth ventilative structure 30D are decreased, and the flow rate of the first ventilative structure 30A and the second ventilative structure 30B are increased accordingly. Due to design of the flank ventilative structure 34, the heat generating component (such as the central processing unit or the main board) disposed inside the electronic device 10 and located by the interface card 12 can be cooled effectively.

TABLE 1

|  | First mode | Second mode | Third mode |
| --- | --- | --- | --- |
| First interface card slot | 46 LFM | 55 LFM | 162 LFM |
| Second interface card slot | 108 LFM | 157 LFM | 216 LFM |
| Third interface card slot | 313 LFM | 460 LFM | 276 LFM |
| Fourth interface card slot | 374 LFM | 250 LFM | 226 LFM |
| Heat generating component | 70° C. | 69° C. | 67° C. |

Figure 13:
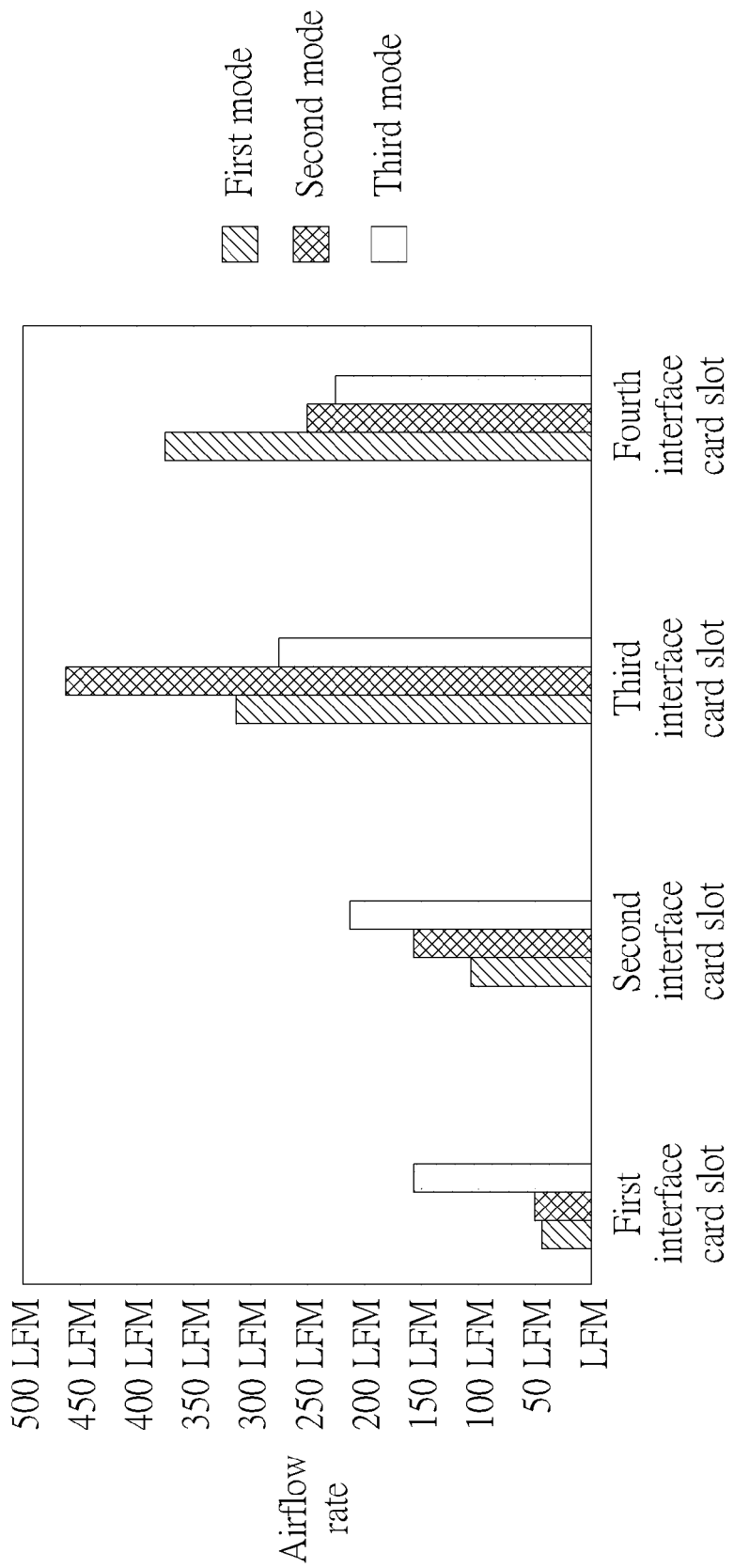
FIG. 13 is a diagram of showing flow rate of the interface card slots in different modes according to embodiment of the present disclosure.
Figure 14:
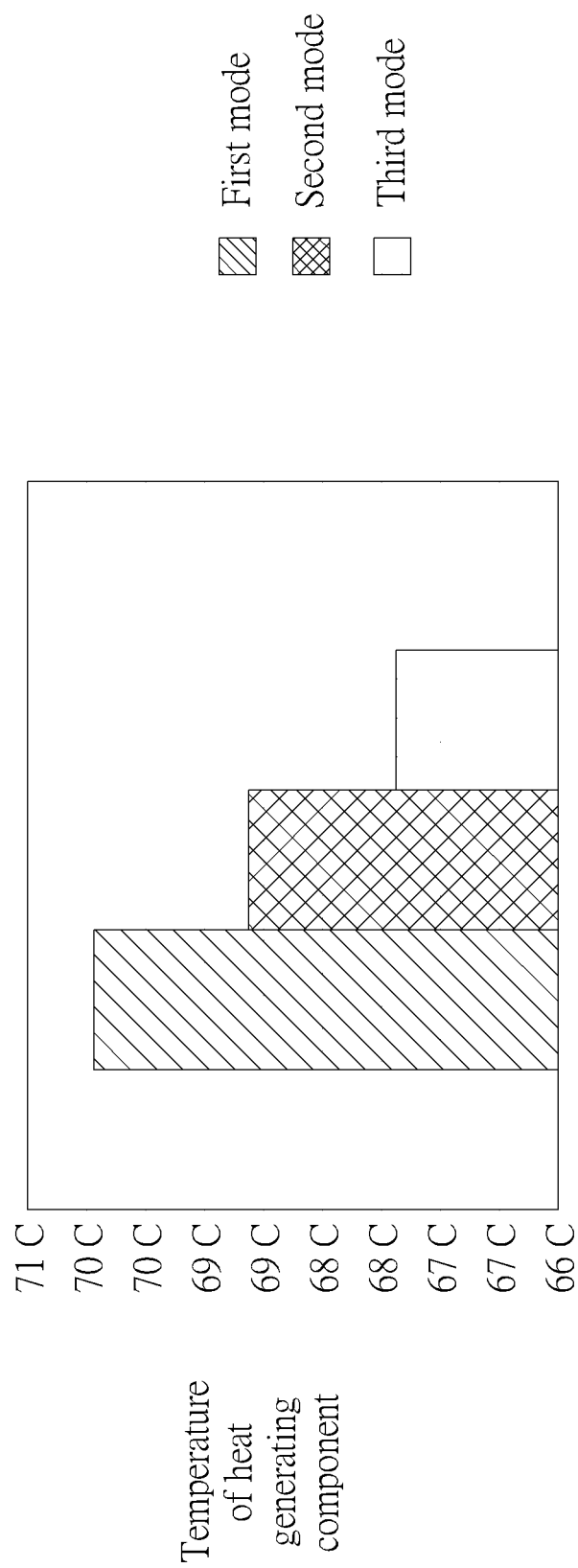
FIG. 14 is a diagram of temperature variation of the heat generating component in different modes according to embodiment of the present disclosure.

Please refer to FIG. 13 and FIG. 14. FIG. 13 is a diagram of showing flow rate of the interface card slots in different modes according to embodiment of the present disclosure. FIG. 14 is a diagram of temperature variation of the heat generating component (which is not the interface card) in different modes according to embodiment of the present disclosure. As shown in FIG. 13 and Table 1, the openings 44 of some interface card slots can be closed, and the cool flow of the flow generating unit 22 is guided to pass through the other interface card slot that has the openings 44 in the open mode. As shown in FIG. 14 and Table 1, temperature of the heat generating component is obviously decreased by a great deal of cooling flow since the whole openings of the interface cards are closed.

In conclusion, the flow guiding mechanism of the present disclosure has a lot of flow gates (combinations of the sheltering component and the ventilative structure) to optimize heat dissipating function of the flow generating unit. The flow guiding mechanism utilizes several track structures to simultaneously assemble with a plurality of interface cards, and the flow of the flow generating unit is applied to cool the interface cards. Each interface card can rotate the corresponding sheltering component to expose the related ventilative structure while the interface card is assembled with the flow guiding mechanism, and the track structure without the interface card does not open the corresponding sheltering component. Therefore, the flow flows toward the unclosed ventilative structure instead of the closed ventilative structure, part of the flow further can be guided toward the flank ventilative structure while most of the ventilative structures are closed, and the heat generating component (located by the supporting component) can be cooled evidently. The cooling flow of the flow generating unit passes through the ventilative structure where the interface card is installed accordingly, and the ventilative structure without the interface card is covered by the sheltering component, part of the cooling flow further flows toward the flank ventilative structure to cool the heat generating component except the interface card. The flow guiding mechanism and the related heat dissipating module and the electronic device of the present disclosure can effectively economize application of the cooling flow, and automatically open or close the ventilative structure according to assembly of the interface card.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flow guiding mechanism with flow channel adjusting function, suitable to be assembled with an electronic device having an interface card, the flow guiding mechanism comprising:

a supporting component, the interface card being adapted to assemble with the supporting component in an assembly direction;

at least one ventilative structure comprising a plurality of openings, the plurality of openings being formed on the supporting component in the assembly direction; and a plurality of sheltering components disposed on the supporting component and respectively corresponding to the plurality of openings, one of the plurality of sheltering components covering a corresponding opening of the plurality of openings while the interface card does not contact the one of the plurality of sheltering components, and the interface card pushing some of the plurality of sheltering components to move relative to the supporting component to expose the corresponding openings while the interface card is assembled with the supporting component.

2. The flow guiding mechanism of claim 1, wherein the supporting component comprises a main slab portion and a plurality of lateral slab portions, the ventilative structure is formed on the main slab portion, the plurality of lateral slab portions is bent from the main slab portion to form an accommodating space, flow generated by a flow generating unit of the electronic device flows toward the ventilative structure through the accommodating space.

3. The flow guiding mechanism of claim 2, further comprising:

a flank ventilative structure formed on at least one of the plurality of lateral slab portions.

4. The flow guiding mechanism of claim 1, wherein the plurality of openings at least comprises a first opening and a second opening sequentially formed on the supporting component in the assembly direction, the plurality of sheltering components at least comprises a first sheltering component and a second sheltering component rotatably disposed adjacent to the first opening and the second opening respectively, and the first sheltering component covers the first opening and the interface card moves the second sheltering component away from the second opening while the interface card is a half-height interface card assembled with the supporting component.

5. The flow guiding mechanism of claim 1, wherein the plurality of openings at least comprises a first opening and a second opening sequentially formed on the supporting component in the assembly direction, the plurality of sheltering components at least comprises a first sheltering component and a second sheltering component rotatably disposed adjacent to the first opening and the second opening respectively, the interface card moves the first sheltering component and the second sheltering component respectively away from the first opening and the second opening while the interface card is a full-height interface card assembled with the supporting component.

6. The flow guiding mechanism of claim 1, wherein each of the plurality of sheltering components comprises:

a pivotal shaft disposed on a pivotal slot on the supporting component;

a sealing portion stretching from the pivotal shaft to seal the corresponding opening; and a pushing portion stretching from the pivotal shaft in an extending direction different from the sealing portion, the interface card pressing the pushing portion to rotate the pivotal shaft so as to move the sealing portion away from the corresponding opening.

7. The flow guiding mechanism of claim 6, wherein each of the plurality of sheltering components further comprises a blocking portion disposed on an end of the sealing portion opposite to the pivotal shaft to lean against the supporting component or an adjacent sheltering component.

8. The flow guiding mechanism of claim 1, wherein the supporting component comprises a track structure whereinside the interface card is disposed in the assembly direction.

9. The flow guiding mechanism of claim 1, wherein a planar normal vector of any opening of the plurality of openings is not perpendicular to the assembly direction.

10. The flow guiding mechanism of claim 1, wherein one of the plurality of sheltering components leans against the supporting component or an adjacent sheltering component by magnetic effect, so as to cover the corresponding opening.

11. The flow guiding mechanism of claim 1, wherein the plurality of sheltering components is rotatably disposed on the supporting component.

12. A heat dissipating module with flow channel adjusting function suitable to be assembled with an electronic device having an interface card, the heat dissipating module comprising:

a frame;

a flow generating unit disposed on a side of the frame; and a flow guiding mechanism disposed on the other side of the frame opposite to the flow generating unit, the flow guiding mechanism comprising:

a supporting component, the interface card being adapted to assemble with the supporting component in an assembly direction;

at least one ventilative structure comprising a plurality of openings, the plurality of openings being formed on the supporting component in the assembly direction; and a plurality of sheltering components disposed on the supporting component and respectively corresponding to the plurality of openings, one of the plurality of sheltering components covering a corresponding opening of the plurality of openings while the interface card does not contact the one of the plurality of sheltering components, and the interface card pushing some of the plurality of sheltering components to move relative to the supporting component to expose the corresponding openings while the interface card is assembled with the supporting component.

13. The heat dissipating module of claim 12, wherein the supporting component comprises a main slab portion and a plurality of lateral slab portions, the ventilative structure is formed on the main slab portion, the plurality of lateral slab portions is bent from the main slab portion to form an accommodating space, flow generated by the flow generating unit flows toward the ventilative structure through the accommodating space.

14. The heat dissipating module of claim 13, wherein the flow guiding mechanism further comprises a flank ventilative structure formed on at least one of the plurality of lateral slab portions.

15. The heat dissipating module of claim 12, wherein the plurality of openings at least comprises a first opening and a second opening sequentially formed on the supporting component in the assembly direction, the plurality of sheltering components at least comprises a first sheltering component and a second sheltering component rotatably disposed adjacent to the first opening and the second opening respectively, the first sheltering component covers the first opening and the interface card moves the second sheltering component away from the second opening while the interface card is a half-height interface card assembled with the supporting component.

16. The heat dissipating module of claim 12, wherein the plurality of openings at least comprises a first opening and a second opening sequentially formed on the supporting component in the assembly direction, the plurality of sheltering components at least comprises a first sheltering component and a second sheltering component rotatably disposed adjacent to the first opening and the second opening respectively, the interface card moves the first sheltering component and the second sheltering component respectively away from the first opening and the second opening while the interface card is a full-height interface card assembled with the supporting component.

17. The heat dissipating module of claim 12, wherein each of the plurality of sheltering components comprises:
   a pivotal shaft disposed on a pivotal slot on the supporting component;
   a sealing portion stretching from the pivotal shaft to seal the corresponding opening; and
   a pushing portion stretching from the pivotal shaft in an extending direction different from the sealing portion, the interface card pressing the pushing portion to rotate the pivotal shaft so as to move the sealing portion away from the corresponding opening.

18. The heat dissipating module of claim 17, wherein each of the plurality of sheltering components further comprises a blocking portion disposed on an end of the sealing portion opposite to the pivotal shaft to lean against the supporting component or an adjacent sheltering component.

19. The heat dissipating module of claim 12, wherein the supporting component comprises a track structure whereinside the interface card is disposed in the assembly direction.

20. The heat dissipating module of claim 12, wherein the frame comprises an engaging structure whereinside the flow generating unit is slidably disposed.

21. The heat dissipating module of claim 12, wherein the supporting component utilizes a fixing component or a buckling component to be disposed on the frame.

22. The heat dissipating module of claim 12, wherein a planar normal vector of any opening of the plurality of openings is not perpendicular to the assembly direction.

23. The heat dissipating module of claim 12, wherein one of the plurality of sheltering components leans against the supporting component or an adjacent sheltering component by magnetic effect, so as to cover the corresponding opening.

24. The heat dissipating module of claim 12, wherein the plurality of sheltering components is rotatably disposed on the supporting component.

25. An electronic device suitable to optionally dispose an interface card, comprising:
   a base, the interface card being disposed on a socket of the base; and
   a heat dissipating module, comprising:
      a frame disposed inside the base;
      a flow generating unit disposed on a side of the frame; and
      a flow guiding mechanism disposed on the other side of the frame opposite to the flow generating unit, the flow guiding mechanism comprising:
         a supporting component, the interface card being adapted to assemble with the supporting component in an assembly direction;
         at least one ventilative structure comprising a plurality of openings, the plurality of openings being formed on the supporting component in the assembly direction; and
         a plurality of sheltering components disposed on the supporting component and respectively corresponding to the plurality of openings, one of the plurality of sheltering components covering a corresponding opening of the plurality of openings while the interface card does not contact the one of the plurality of sheltering components, and the interface card pushing some of the plurality of sheltering components to move relative to the supporting component to expose the corresponding openings while the interface card is assembled with the supporting component.

26. The electronic device of claim 25, wherein the supporting component comprises a main slab portion and a plurality of lateral slab portions, the ventilative structure is formed on the main slab portion, the plurality of lateral slab portions is bent from the main slab portion to form an accommodating space, flow generated by the flow generating unit flows toward the ventilative structure through the accommodating space.

27. The electronic device of claim 26, wherein the flow guiding mechanism further comprises a flank ventilative structure formed on at least one of the plurality of lateral slab portions.

28. The electronic device of claim 25, wherein the plurality of openings at least comprises a first opening and a second opening sequentially formed on the supporting component in the assembly direction, the plurality of sheltering components at least comprises a first sheltering component and a second sheltering component rotatably disposed adjacent to the first opening and the second opening respectively, the first sheltering component covers the first opening and the interface card moves the second sheltering component away from the second opening while the interface card is a half-height interface card assembled with the supporting component.

29. The electronic device of claim 25, wherein the plurality of openings at least comprises a first opening and a second opening sequentially formed on the supporting component in the assembly direction, the plurality of sheltering components at least comprises a first sheltering component and a second sheltering component rotatably disposed adjacent to the first opening and the second opening respectively, the interface card moves the first sheltering component and the second sheltering component respectively away from the first opening and the second opening while the interface card is a full-height interface card assembled with the supporting component.

30. The electronic device of claim 25, wherein each of the plurality of sheltering components comprises:
   a pivotal shaft disposed on a pivotal slot on the supporting component;
   a sealing portion stretching from the pivotal shaft to seal the corresponding opening; and
   a pushing portion stretching from the pivotal shaft in an extending direction different from the sealing portion, the interface card pressing the pushing portion to rotate the pivotal shaft so as to move the sealing portion away from the corresponding opening.

31. The electronic device of claim 30, wherein each of the plurality of sheltering components further comprises a blocking portion disposed on an end of the sealing portion opposite to the pivotal shaft to lean against the supporting component or an adjacent sheltering component.

32. The electronic device of claim 25, wherein the supporting component comprises a track structure whereinside the interface card is disposed in the assembly direction.

33. The electronic device of claim 25, wherein the frame comprises an engaging structure whereinside the flow generating unit is slidably disposed.

34. The electronic device of claim 25, wherein the supporting component utilizes a fixing component or a buckling component to be disposed on the frame.

35. The electronic device of claim 25, wherein a planar normal vector of any opening of the plurality of openings is not perpendicular to the assembly direction.

36. The electronic device of claim 25, wherein one of the plurality of sheltering components leans against the supporting component or an adjacent sheltering component by magnetic effect, so as to cover the corresponding opening.

37. The electronic device of claim 25, wherein the plurality of sheltering components is rotatably disposed on the supporting component.

* * * * *